(12) United States Patent
Liu et al.

(10) Patent No.: US 8,988,924 B2
(45) Date of Patent: Mar. 24, 2015

(54) METHOD, SYSTEM, AND DEVICE FOR HEATING A PHASE CHANGE MEMORY (PCM)CELL

(75) Inventors: Jun Liu, Boise, ID (US); Jian Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 400 days.

(21) Appl. No.: 13/457,363

(22) Filed: Apr. 26, 2012

(65) Prior Publication Data
US 2013/0286724 A1 Oct. 31, 2013

(51) Int. Cl.
*G11C 11/00* (2006.01)
*G11C 13/00* (2006.01)
*H01L 45/00* (2006.01)

(52) U.S. Cl.
CPC .......... *H01L 45/126* (2013.01); *G11C 13/0004* (2013.01); *G11C 13/0069* (2013.01); *G11C 2013/008* (2013.01); *G11C 2213/52* (2013.01); *H01L 45/06* (2013.01); *H01L 45/1233* (2013.01)
USPC ........................................... 365/148; 365/163

(58) Field of Classification Search
USPC .................. 365/148, 163, 211; 257/E21.536, 257/E29.143
See application file for complete search history.

(56) References Cited

U.S. PATENT DOCUMENTS

| | | | |
|---|---|---|---|
| 7,667,998 B2 * | 2/2010 | Jeong et al. | 365/148 |
| 7,859,036 B2 | 12/2010 | Liu et al. | |
| 7,969,771 B2 * | 6/2011 | Xi et al. | 365/163 |
| 7,983,068 B2 | 7/2011 | Ufert | |
| 8,440,991 B2 * | 5/2013 | Park et al. | 257/4 |
| 2004/0188668 A1 * | 9/2004 | Hamann et al. | 257/2 |
| 2007/0075347 A1 | 4/2007 | Lai et al. | |
| 2009/0095951 A1 | 4/2009 | Kostylev et al. | |
| 2010/0117046 A1 | 5/2010 | Chang et al. | |
| 2011/0073829 A1 | 3/2011 | Park et al. | |

* cited by examiner

*Primary Examiner* — Vu Le
(74) *Attorney, Agent, or Firm* — Knobbe, Martens, Olson & Bear LLP

(57) ABSTRACT

Embodiments disclosed herein may relate to heating a phase change memory (PCM) cell.

20 Claims, 6 Drawing Sheets

600

METHOD, SYSTEM, AND DEVICE FOR HEATING A PHASE CHANGE MEMORY (PCM) CELL

BACKGROUND

1. Field

Subject matter disclosed herein may relate to integrated circuit devices, and may relate, more particularly, to memory devices.

2. Information

Integrated circuit devices, such as memory devices, for example, may be found in a wide range of electronic devices. For example, memory devices may be used in computers, digital cameras, cellular telephones, personal digital assistants, etc. Factors related to a memory device that may be of interest in considering suitability for any particular application may include, physical size, storage density, operating voltages, granularity of read/write operations, throughput, transmission rate, and/or power consumption, for example. Other example factors that may be of interest may include cost of manufacture, and/or ease of manufacture.

BRIEF DESCRIPTION OF THE DRAWINGS

Claimed subject matter is particularly pointed out and/or distinctly claimed in the concluding portion of the specification. However, both as to organization and/or method of operation, together with objects, features, and/or advantages thereof, it may best be understood by reference to the following detailed description if read with the accompanying drawings in which:

Reference is made in the following detailed description to the accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to others. Further, it is to be understood that other embodiments may be utilized. Furthermore, structural and/or functional changes may be made without departing from the scope of claimed subject matter. It should also be noted that directions and/or references, for example, such as up, down, top, bottom, and so on, may be used to facilitate discussion of drawings and/or are not intended to restrict application of claimed subject matter. Therefore, the following detailed description is not to be taken to limit the scope of claimed subject matter and/or equivalents.

DETAILED DESCRIPTION

Integrated circuit devices, such as non-volatile memory devices, may be found in a wide range of electronic devices. Non-volatile memory devices may be used in computers, digital cameras, cellular telephones, and/or personal digital assistants, to name but a few examples. Factors related to a non-volatile memory device that may be of interest in considering suitability for a particular application may include physical size, storage density, operating voltages, granularity of read/write operations, throughput, transmission rate, cost of manufacture, and/or ease of manufacture, for example. Other example aspects that may be of interest in considering suitability for a particular application may include power consumption and/or programming voltage and/or current. An example type of non-volatile memory device may comprise a phase change memory (PCM) device, in an embodiment.

Figure 1:
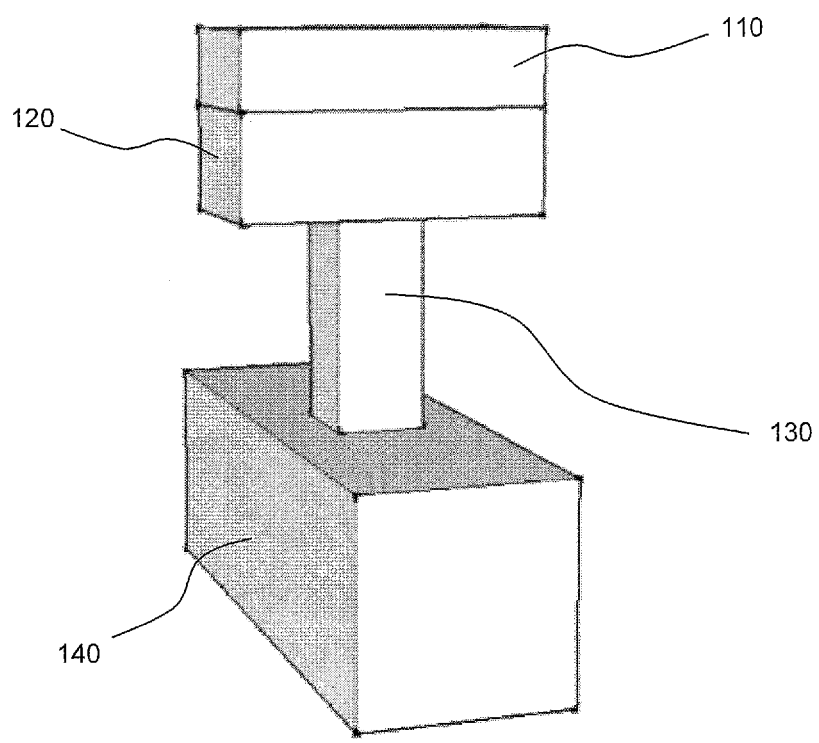
FIG. 1 is an illustration depicting an isometric view of an example apparatus including a phase change memory (PCM) cell according to an embodiment.

FIG. 1 is an illustration depicting an isometric view of an example apparatus 100 that may include a phase change memory (PCM) cell, such as 120, according to an embodiment. Apparatus 100 may comprise memory cell 120, a "top" electrode 110, and a "bottom" electrode 130. It should be noted that directions and/or references, for example, such as up, down, top, bottom, and so on, may be used to facilitate discussion of drawings and/or are not intended to restrict application of claimed subject matter. However, it is noted that for the embodiment illustrated, current may flow from electrode 130 to electrode 110 during programming of the cell, for example, although claimed subject matter is not limited in scope in this respect. In another embodiment, current may flow in a different direction, for example.

A portion of an electrically conductive component 140 is also depicted in FIG. 1. In an embodiment, an electrically conductive component, such as electrically conductive component 140, may comprise a component that may be utilized to route electrical signals and/or power within a memory array, for example. An electrically conductive component, such as an electrically conductive component 140, may comprise a sufficiently electrically conductive material, such as polysilicon, carbon, and/or metallic material, such as tungsten, titanium nitride, and/or titanium aluminum nitride, for example, for use in a memory device. Of course, claimed subject matter is not limited in scope in these respects. Other materials may, of course, also be used in an embodiment. Also in an embodiment, top electrode 110 may comprise a sufficiently electrically conductive material, such as polysilicon, carbon, and/or metallic material, such as tungsten, titanium nitride, and/or titanium aluminum nitride, for example, for use in a memory device, although again claimed subject matter is not limited in scope in these respects.

In an embodiment, cell 120 may comprise a memory material, such as a chalcogenide glass material. A PCM cell, such as 120, may comprise a memory material capable of storing one or more of at least two different selectable states to thereby operate as a memory. For example, in a binary system, states may be considered a binary "0" or a binary "1." In an embodiment, a "set" state, representing a binary value of '1,' for example, may correspond to a more crystalline, more conductive state for memory material of a PCM cell, such as 120. Also, in an embodiment, a "reset" state, representing a binary value of '0,' for example, may correspond to a more amorphous, more resistive state of a memory material for a PCM cell, such as 120. Of course, assignment of states to particular binary values may be different than the example above. Furthermore, in other systems, an individual memory component may have a configuration in which the number of selectable states may be more than two.

For a PCM cell, heat of a sufficient amount may be employed to change state and may be achieved by generating a current and/or voltage pulse to be utilized with an electrode, such as bottom electrode 130, in a manner to affect a proximate PCM cell, such as 120, in an embodiment. In the embodiment illustrated 130 is in direct physical contact with cell 120, for example. Of course, in one or more example embodiments, memory arrays may comprise one or more technologies other than PCM, such as resistive memory technologies and/or other types of memory. Therefore, claimed subject matter is not limited in scope in this respect.

In an example embodiment, heat sufficient to change state of a PCM cell, such as 120, may be produced, for example, in connection with an electrode, such as bottom electrode 130, due at least in part to current flowing through the electrode. Heat may, as a result, also be generated to affect the proximate PCM cell. In an embodiment, for example, a current may flow through an electrode, such as bottom electrode 130, and through a PCM cell, such as 120, at least in part as a result of a voltage across electrodes, such as electrically conductive electrode 140 and top electrode 110, for example. In an embodiment, an amount of heat generated may depend, at least in part, on one or more characteristics of an electrode, such as bottom electrode 130, one or more characteristics of a PCM cell, such as 120, and/or on an amount of voltage across the electrodes, such as a bottom electrode, such as 130, a top electrode, such as 110, and/or a PCM cell, such as 120, for example.

In an embodiment, an amount of current to flow through an electrode, such as bottom electrode 130, and through a PCM cell, such as 120, may depend at least in part on a resistance of an electrode, such as bottom electrode 130, and/or of a PCM cell, such as 120. For example, an expression for a measurable resistance of an electrode, such as bottom electrode 130, and a PCM cell, such as 120, having a series arrangement, may comprise:

$$R_M = R_{SC} + R_{BE} \tag{1}$$

wherein $R_M$ represents a measurable series resistance, wherein $R_{SC}$ comprises a resistance of a PCM cell, such as 120, and wherein $R_{BE}$ comprises a resistance of an electrode, such as bottom electrode 130. In an embodiment, a PCM cell, such as 120, for example, may exhibit different resistance characteristics depending at least in part on whether the cell is programmed to a more conductive, set state or to a more resistive, reset state, as a result of a set or reset state of the memory material, for example.

A memory device, in an embodiment, may be considered to be capable of detecting a state of a particular PCM cell, such as PCM cell 120, based at least in part on a ratio of a measurable resistance of the particular cell in a reset state to a measurable resistance of the particular cell in a set state, although, of course, other measures may be employed. A ratio may be expressed as:

$$R_{off}/R_{on} \tag{2}$$

wherein $$R_{off} = R_{reset} + R_{BE} \tag{3}$$

and $$R_{on} = R_{set} + R_{BE} \tag{4}$$

yielding $$\frac{R_{reset} + R_{BE}}{R_{set} + R_{BE}} \tag{5}$$

wherein $R_{set}$ comprises a resistance of a PCM cell, such as 120, in a set state, wherein $R_{reset}$ comprises a resistance of a PCM cell, such as 120, in a reset state, and wherein $R_{BE}$ comprises a resistance of an electrode, such as bottom electrode 130.

As may be seen in expression (5) above, if a resistance characteristic for an electrode, such as bottom electrode 130, in a PCM cell, such as PCM cell 120, remains approximately constant, resistance values for a PCM cell, such as storage 120, in a more conductive, set state and in a more resistive, reset state may affect the value of the ratio. Therefore, the ratio may be considered to reflect the ability to discern one state from another for a PCM cell, such as 120.

Additionally, in an embodiment, sufficient heat to change state of a PCM cell, such as to program it, may be achieved under a condition of a reduced programming voltage and/or current if resistivity of an electrode, such as bottom electrode 130, were increased. For example, if resistivity were increased, sufficient heat may be generated using less power, such as a lower signal value level of voltage and/or current. However, an increase in resistivity of an electrode, such as bottom electrode 130, may result in an on/off ratio being closer to unity than a situation involving lower resistivity. If this occurs, one potential risk may be that measurable resistance of a PCM cell in a set state may become more similar to measurable resistance of a PCM cell in a reset state. This may potentially result in a reduction in an ability to sufficiently discern a set state from a reset state, for example, and/or vice-versa.

However, some embodiments in accordance with claimed subject matter may satisfactorily address a situation such as this if resistivity were capable of increasing in an environment of increasing heat, but otherwise did not increase and/or did not increase as much for an ambient temperature environment, such as around room temperature, for example. In an embodiment, an electrode, such as bottom electrode 130, for example may comprise a sufficiently electrically conductive material so as to provide a relatively large positive temperature coefficient of resistance, providing a resistivity that increases with an increase in temperature. In an embodiment, for example, an electrode, such as bottom electrode 130, may have a smaller resistance at room temperature, than at a more elevated temperature including, for example, a temperature at which memory material for a PCM cell may melt. In this manner, an electrode, such as bottom electrode 130, may have a smaller resistance at room temperature that may provide for a PCM cell on/off resistance ratio that may permit a sufficiently different resistivity so that adequate determination of a state of a particular PCM cell is possible; nonetheless, a PCM cell may also have a relatively higher resistance at a relatively higher temperature, such as a temperature sufficient to melt memory material of a PCM cell. Improved memory material heating efficiency may allow for a reduction in a voltage and/or current signal value level. In an embodiment, an electrode, such as bottom electrode 130, may comprise $BaTiO_3$, for example, although claimed subject matter is not limited in scope in this respect.

Figure 2:
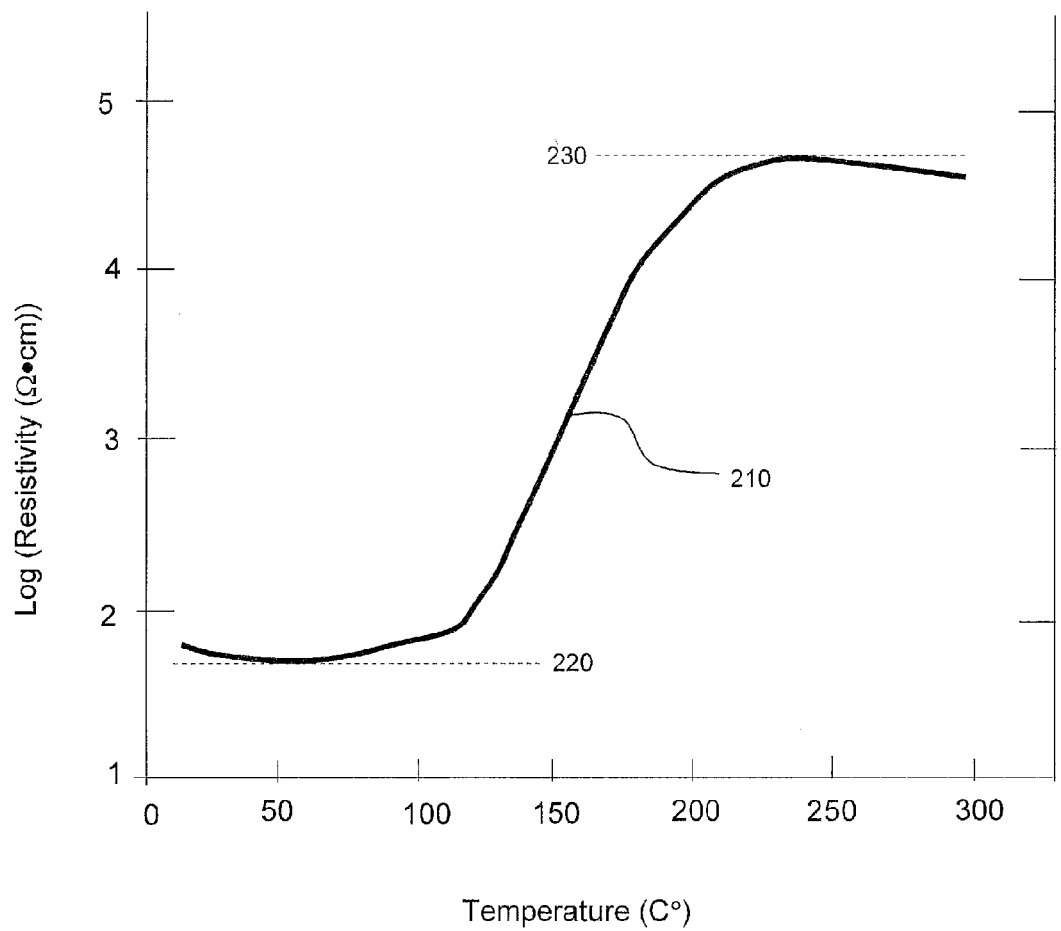
FIG. 2 is a graph in which resistivity is plotted against temperature for a memory material that may be utilized in a PCM cell according to an embodiment.

FIG. 2 is a plot of example resistivity against temperature for gig $BaTiO_3$, for example, that may comprise a material to be employed as an electrode for a PCM cell. FIG. 2 illustrates an example of a material providing a sufficiently large positive temperature coefficient of resistance (TCR) material to be utilized in an electrode, such as bottom electrode 130, in a PCM cell, such as PCM cell 120, for an embodiment. In an embodiment, bottom electrode 130 may comprise $BaTiO_3$, for example. Of course, other embodiments may utilize other electrically conductive materials to provide a sufficiently large positive TCR. As used herein, the term "sufficiently large positive temperature coefficient of resistance" includes a positive temperature coefficient of resistance of approximately 0.01 or greater. In an embodiment, a material, such as $BaTiO_3$, for example, may have a positive TCR of approximately 0.05, although claimed subject matter is not limited in this respect. Furthermore, it is noted that some materials may exhibit a sufficiently large TCR while also exhibiting non-linear behavior as a function of increasing temperature, for example. A non-linear TCR that exhibits a sufficiently large positive temperature coefficient of resistance may, for example, exhibit approximately 0.01 or greater on average over a relevant range of temperatures, such as, for example, from approximately 120° C. to approximately 200° C. or greater.

As depicted in FIG. 2, an example curve 210 may correspond to a $BaTiO_3$ material, for example, having a lower level 220 of resistivity at a temperature range of approximately less than 120° C., and having a higher level 230 of resistivity at a temperature range of approximately greater than 200° C. For the example depicted in FIG. 2, resistivity increases substantially rapidly and substantially linearly in a temperature range of approximately 120° C. and 200° C. Of course, characteristics depicted in FIG. 2 are merely examples, and other embodiments may utilize materials that are adequate having characteristics that differ from those depicted in FIG. 2.

TABLE 1

Example Materials with positive temperature coefficient of resistance

| Material | Resistivity (Ω · m) | TCR | Reset Voltage (V) | Reset Current (mA) | $R_{reset}$ (Q) | $R_{set}$ (Q) |
| --- | --- | --- | --- | --- | --- | --- |
| $V_2O_3$ | 1.00E−05 | .01 | 1.05 | 468 | 7.38E+05 | 1009 |
| Doped - $BaTiO_3$ | 1.00E−05 | 0.05 | 1.10 | 314 | 8.03E+05 | 1008 |

Table 1 provides example characteristics for example materials that exhibit sufficiently large positive TCR to be utilized, for example, in an electrode. For the material $BaTiO_3$, for example, an approximate TCR of 0.05 is exhibited, along with an approximate resistivity of 1.00E−05Ω·m at room temperature. For an example embodiment of a PCM cell utilizing a bottom electrode comprising gig $BaTiO_3$, a reset voltage signal value level of approximately 1.10V and a reset current signal value level of approximately 314 mA may be employed. Also, in an embodiment, a value level for $R_{reset}$ may be estimated as 803 kΩ and a value level for $R_{set}$ may be estimated as 1008Ω. Of course, value levels from Table 1 are merely examples, and claimed subject matter is not limited in these respects.

As indicated previously, Table 1 provides an estimated value level for $R_{reset}$ of 803 kΩ and an estimated value level for $R_{set}$ of 1008Ω. It may be noted that the example value level for $R_{reset}$ for an example embodiment of a PCM cell is several orders of magnitude greater than the example value level for $R_{set}$. In an embodiment, a difference between $R_{reset}$ and $R_{set}$ may be attributable at least in part to a sufficiently large positive TCR for a material of an electrode, such as bottom electrode 130, of an example PCM cell, such as PCM cell 120. Also in an embodiment, by utilizing a material with a sufficiently large positive TCR for an electrode, such as bottom electrode 130, in a PCM cell, bottom electrode 130 may have a lower resistance at approximately room temperature, such as at a temperature at which a state of PCM cell 120 may be sensed.

Referring to expressions (2) through (5) above, note again that a lower resistance in an electrode, such as bottom electrode 130, may have a beneficial affect on an on/off resistance ratio, thereby increasing a likelihood of being able to sufficiently discern a state of a particular PCM cell, such as PCM cell 120, in an embodiment. Additionally, a higher resistivity value for an electrode, such as bottom electrode 130, may result in an increase in heat generation efficiency for a PCM cell, such as PCM cell 120, in an embodiment. An increase in heat generation efficiency may allow for a reduction in programming voltage and/or current, for example, in an embodiment. Additionally, an increase in heat generation efficiency may allow for a reduction in bottom electrode size, for example.

Figure 3:
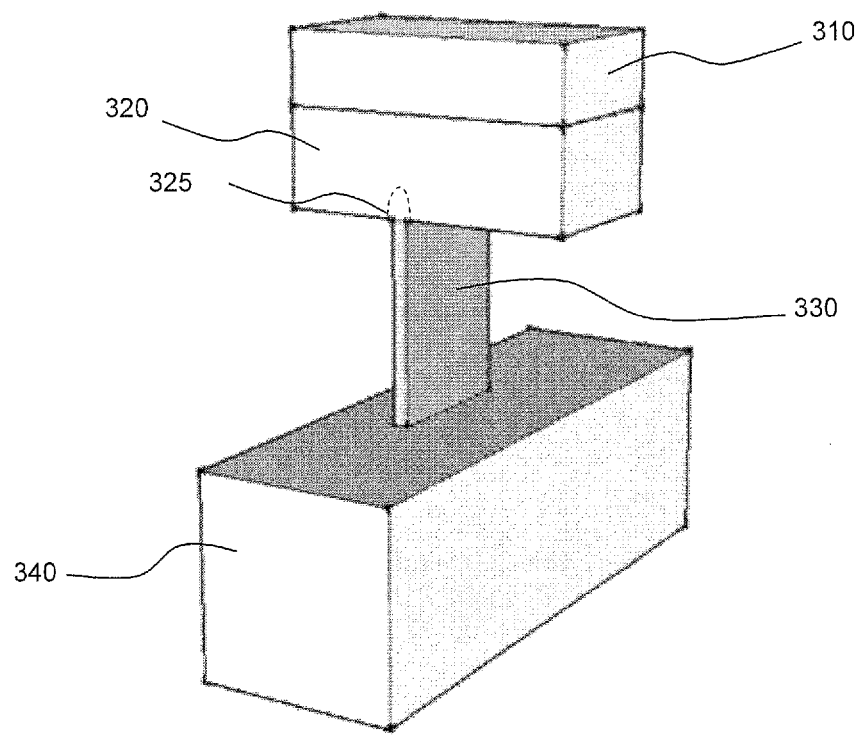
FIG. 3 is an illustration depicting an isometric view of another example apparatus including a phase change memory (PCM) cell according to an embodiment.

FIG. 3 is an illustration depicting an isometric view of an example apparatus 300, including an example PCM cell 320, according to an embodiment. In an embodiment, a PCM cell, such as PCM cell 320, may comprise an electrode, such at top electrode 310, a memory cell, such as 320, and an electrode, such as bottom electrode 330, for example. Also, in an embodiment, a PCM cell, such as PCM cell 320, may comprise an electrically conductive component 340. In an embodiment, a PCM cell, such as PCM cell 320, may comprise one or more aspects that are similar to corresponding aspects of an example PCM cell, such as PCM cell 120, described above. In an embodiment, an electrically conductive component, such as an electrically conductive component 340, may comprise a sufficiently electrically conductive material, such as polysilicon, carbon, and/or metallic material, such as tungsten, titanium nitride, and/or titanium aluminum nitride, for example, for use in a memory device. Also in an embodiment, top electrode 310 may comprise a sufficiently electrically conductive material, such as polysilicon, carbon, and/or metallic material, such as tungsten, titanium nitride, and/or titanium aluminum nitride, for example, for use in a memory device, although again claimed subject matter is not limited in scope in these respects. A memory cell, such as PCM cell 320, may comprise a memory material, such as a chalcogenide glass material, for example.

Additionally, in an embodiment, an electrode, such as bottom electrode 330, may comprise a narrow component having wall-type shape, such as may be manufactured at least in part by conformally depositing a material having a sufficiently large positive TCR, such as $BaTiO_3$, for example, over and/or on an approximately vertical wall of a trench positioned in a dielectric material. In an embodiment, a thickness of a conformal deposition of a material with a sufficiently large positive TCR on a trench wall may affect, at least in part, a dimension of an electrode, such as bottom electrode 330. Of course, embodiments in accordance with claimed subject matter are not limited to any particular manufacturing techniques.

Also depicted in FIG. 3 is a region 325 within PCM cell 320. In an embodiment, a portion of a PCM cell, such as PCM cell 320, may melt as a result of sufficient heat and/or may change state with utilization of sufficient heat. In FIG. 3, region 325 is meant to depict an approximate region within PCM cell 320 that may experience a significant enough increase in heat to affect a change in state of a memory material within region 325. In an embodiment, a material with relatively high resistivity at relatively high temperature, such as at temperatures sufficient to melt at least a portion of a PCM cell, such as cell 320, may provide focused heat due at least in part to improved efficiency in heat generation provided by a material, such as $BaTiO_3$, for example. A region within a PCM cell, such as PCM cell 320, may reduce a likelihood of thermal cross-talk with an immediately adjacent PCM cell as a result. Additionally, in an embodiment, utilization of a material with a relatively high resistivity at relatively high temperatures, such as at temperatures sufficient to melt at least a portion of a PCM cell may result in decreased heat loss through an electrode, such as bottom electrode 330, for example, since heat may be conducted away from a PCM cell more slowly for materials exhibiting a sufficiently high TCR. A reduction in operating temperature may also result, in an embodiment, potentially providing improved memory device reliability.

Figure 4:
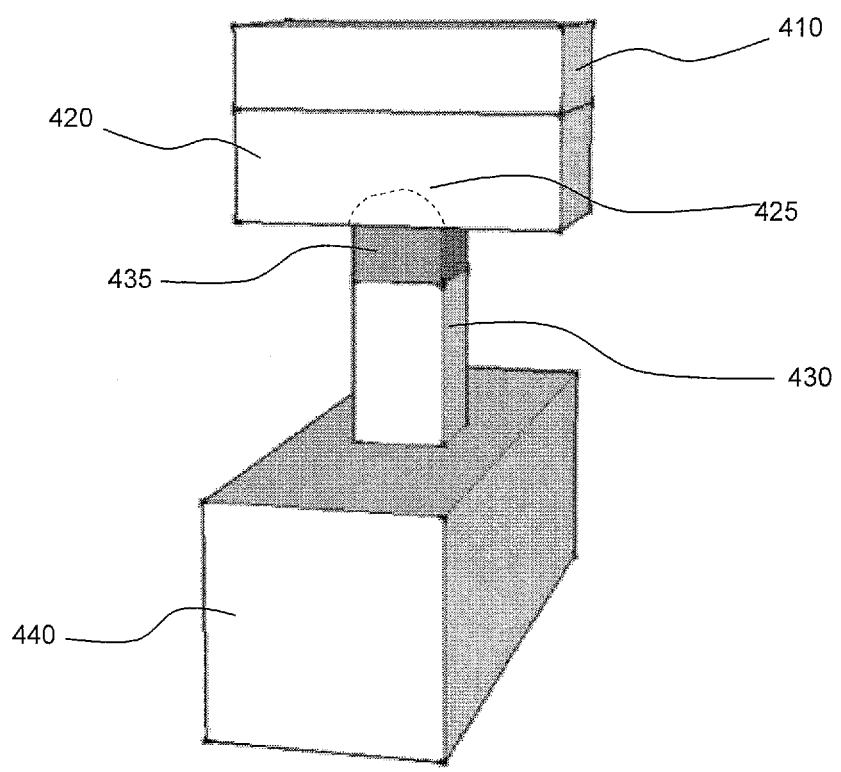
FIG. 4 is an illustration depicting an isometric view of yet another example apparatus including a phase change memory (PCM) cell, according to an embodiment.

FIG. 4 is an illustration depicting an isometric view of an example apparatus 400, including an example PCM cell 420, according to an embodiment. In an embodiment, a PCM cell, such as PCM cell 420, may comprise an electrode, such as top electrode 410, a memory cell, such as 420, and an electrode, such as bottom electrode 430, for example. Also, in an embodiment, a PCM cell, such as PCM cell 420, may comprise an electrically conductive component 440. In an embodiment, a PCM cell, such as PCM cell 420, may comprise one or more aspects that are similar to corresponding aspects of example PCM cells, such as PCM cells 120 and/or 320, described above. In an embodiment, an electrically conductive component, such as an electrically conductive component 440, may comprise a sufficiently electrically conductive material, such as polysilicon, carbon, and/or metallic material, such as tungsten, titanium nitride, and/or titanium aluminum nitride, for example, for use in a memory device. Also in an embodiment, top electrode 410 may comprise a sufficiently electrically conductive material, such as polysilicon, carbon, and/or metallic material, such as tungsten, titanium nitride, and/or titanium aluminum nitride, for example, for use in a memory device, although again claimed subject matter is not limited in scope in these respects. A memory cell, such as PCM cell 420, may comprise a memory material, such as, a chalcogenide glass material, for example.

Further, in an embodiment, PCM cell 420 may comprise a hybrid-type bottom electrode, including a sufficiently large positive TCR portion 435, and another portion 430. In an embodiment, portion 435 may comprise $BaTiO_3$, for example. Also in an embodiment, portion 430 may comprise TiN, for example. Also depicted in FIG. 4 is a region 425 within PCM cell 420. In an embodiment, region 425 is meant to depict an approximate region within PCM cell 420 that may experience a significant enough increase in heat to affect a change in state of memory material within region 425. In an embodiment, a material utilized for portion 435 with a relatively high resistivity at higher temperatures, including temperatures sufficient to melt at least a portion of PCM cell, such as 420, may provide relatively focused heat to region 425 due at least in part to improved efficiency in heat generation provided by a material, such as $BaTiO_3$, for example, having a sufficiently large positive TCR. Region 425 within a PCM cell, such as PCM cell 420, may provide one or more potential benefits, including a reduced likelihood of thermal cross-talk with immediately adjacent PCM cells, a decrease in heat loss through an electrode, such as bottom electrode portion 435, and/or a reduction in operating temperature that may result in improved memory device reliability, among others.

Although example embodiments are described herein with an example shape for electrode 435, claimed subject matter is not limited in scope in these respects. For example, embodiments are possible utilizing a shape for electrode 435 similar to that depicted in FIG. 3 for bottom electrode 330, although again, claimed subject matter is not limited in scope in this respect.

Additionally, other embodiments are possible with various shapes and configurations for PCM cells, such as PCM cell 420. For example, in an embodiment, for example as depicted in FIG. 5 discussed below, a PCM cell may comprise a confined cell structure, although again, claimed subject matter is not limited in this respect.

Figure 5:
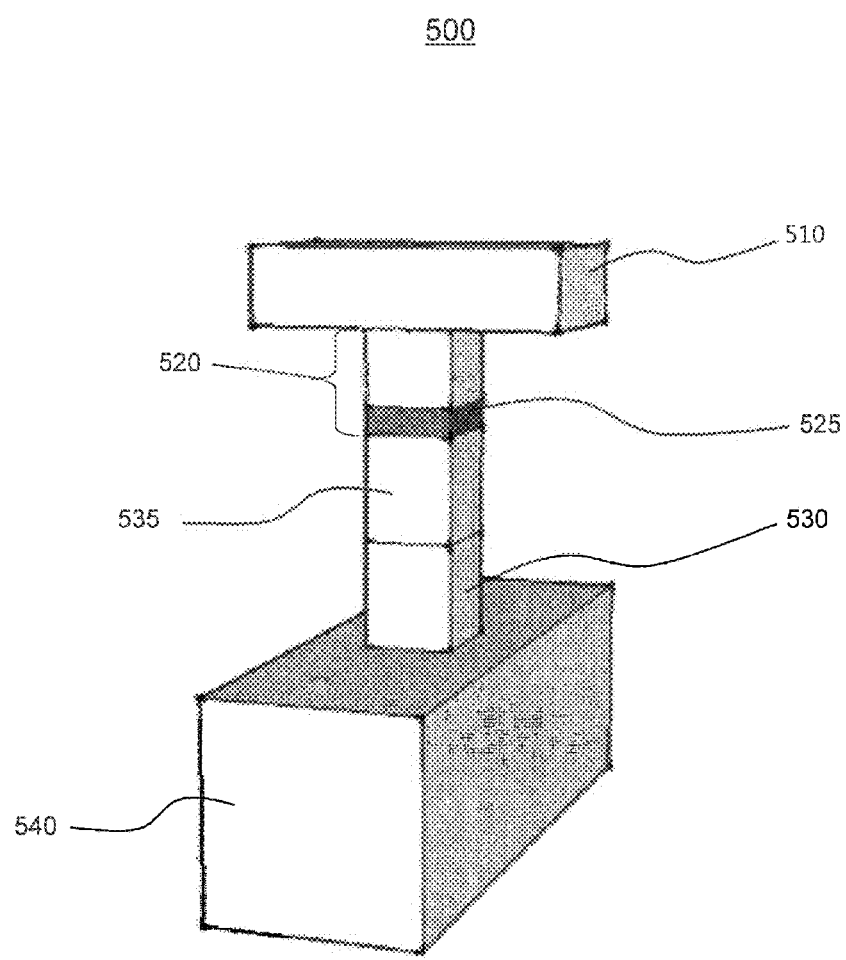
FIG. 5 is an illustration depicting an isometric view of another example apparatus including a phase change memory (PCM) cell, according to an embodiment.

FIG. 5 is an illustration depicting an isometric view of an example apparatus 500 including an example PCM cell 520, according to an embodiment. PCM cell 520 may comprise a confined cell structure, in an embodiment. Also, in an embodiment, an apparatus, such as apparatus 500, may comprise an electrode, such as top electrode 510, and an electrode, such as bottom electrode 530, for example. Also, in an embodiment, apparatus 500 may comprise an electrically conductive component 540. In an embodiment, a PCM cell, such as PCM cell 520, may comprise one or more aspects that are similar to corresponding aspects of example PCM cells, such as PCM cells 120 and/or 320, described above. In an embodiment, an electrically conductive component, such as an electrically conductive component 540, may comprise a sufficiently electrically conductive material, such as polysilicon, carbon, and/or metallic material, such as tungsten, titanium nitride, and/or titanium aluminum nitride, for example, for use in a memory device. Also in an embodiment, top electrode 510 may comprise a sufficiently electrically conductive material, such as polysilicon, carbon, and/or metallic material, such as tungsten, titanium nitride, and/or titanium aluminum nitride, for example, for use in a memory device, although again claimed subject matter is not limited in scope in these respects. A memory cell, such as PCM cell 520, may comprise a phase change material, such as, a chalcogenide glass material, for example.

Further, in an embodiment, PCM cell 520 may comprise a hybrid-type bottom electrode, including a sufficiently large positive TCR portion 535, and another portion 530. In an embodiment, portion 535 may comprise $BaTiO_3$, for example.

Also in an embodiment, portion 530 may comprise TiN, for example. Also depicted in FIG. 5 is a region 525 within PCM cell 520. In an embodiment, region 525 is meant to depict an approximate region within PCM cell 520 that may experience a significant enough increase in heat to affect a change in state of phase change material within region 525. In an embodiment, a material utilized for portion 535 with a relatively high resistivity at higher temperatures, including temperatures sufficient to melt at least a portion of a PCM cell 520 may provide relatively focused heat to region 525 due at least in part to improved efficiency in heat generation provided by a material, such as $BaTiO_3$, for example, having a sufficiently large positive TCR.

Although example embodiments are described herein as utilizing $BaTiO_3$, for electrodes, such as bottom electrodes 130, 330, 430, and/or 530, other embodiments may utilize other materials having characteristics including a sufficiently large positive TCR. Several additional example materials are listed, although the list is not intended to be exhaustive, and claimed subject matter is not limited to this particular example.

Figure 6:
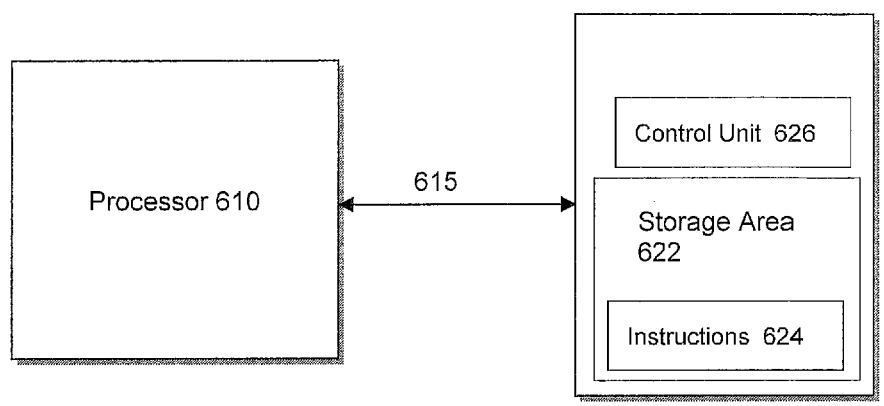
FIG. 6 is a schematic block diagram depicting a system which may include a PCM device according to an embodiment.

$BaTiO_3$-based compounds ($BaSrTi3O$, $BaPbTiO3$ ... )
Mn-doped $Ba_{0.8}Sr_{0.2}TiO3$ $(Ba_{0.996}Y_{0.004})TiO3$ and $(Ba_{0.746}Ca_{0.1}Sr_{0.15}Y_{0.004})TiO3$
$(Ba_{0.85}Pb_{0.15})TiO3$
V2O3 based compound
$ZnO—TiO_2—NiO$ ceramic
La2/3Ca1/3MnO$_3$
SnO2+2CoO and SnO2+Cr2O3 ceramics
$Pb(Fe_{1/2}N_{1/2})O_3$
$MoSi_x$, $TCR(3.1-3.9)*10^{-3} K^{-1}$ FIG. 6 is a schematic block diagram depicting an example system 600 including an example PCM device 620. In an embodiment, PCM device 620 may comprise a storage area 622 including an array of PCM cells, such as in accordance with one or more examples. PCM device 620 may, in an example embodiment, be coupled to a processor 610 by way of an interconnect 615.

PCM device 620 in an embodiment may comprise a control unit 626. Additionally, storage area 622 may store instructions 624 that may include one or more applications that may be executed by processor 610, according with an embodiment. Processor 610 may transmit a memory access command to PCM device 620, for example. Control unit 626 may access one or more memory cells of storage area 622 at least in part in response to receiving the memory access command from processor 610, according to an embodiment. Of course, computing platform 600 is merely one example of a system implemented in accordance with claimed subject matter, and the scope of claimed subject matter is not limited in these respects.

The term "computing platform" as used herein refers to a system and/or a device that includes the ability to process and/or store data in the form of signals and/or states. Thus, a computing platform, in this context, may comprise hardware, software, firmware or any combination thereof (other than software per se). Computing platform 600, as depicted in FIG. 6, is merely one such example, and the scope of claimed subject matter is not limited to this particular example. For one or more embodiments, a computing platform may comprise any of a wide range of digital electronic devices, including, but not limited to, personal desktop or notebook computers, high-definition televisions, digital versatile disc (DVD) players and/or recorders, game consoles, satellite television receivers, cellular telephones, personal digital assistants, mobile audio and/or video playback and/or recording devices, or any combination of the above. Further, unless specifically stated otherwise, a process as described herein, with reference to flow diagrams and/or otherwise, may also be executed and/or controlled, in whole or in part, by a computing platform.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, and/or characteristic in the singular and/or may be used to describe a plurality or some other combination of features, structures and/or characteristics. Though, it should be noted that this is merely an illustrative example and claimed subject matter is not limited to this example.

Methodologies described herein may be implemented by various techniques depending, at least in part, on applications according to particular features and/or examples. For example, methodologies may be implemented in hardware, firmware, or combinations thereof, along with software (other than software per se). In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other device units designed to perform function described herein, or combinations thereof.

In the preceding detailed description, numerous specific details have been set forth to provide a thorough understanding of claimed subject matter. However, it will be understood by those skilled in the art that claimed subject matter may be practiced without these specific details. In other instances, methods and/or apparatuses that would be known by one of ordinary skill have not been described in detail so as not to obscure claimed subject matter.

Some portions of the preceding detailed description have been presented in terms of logic, algorithms and/or symbolic representations of operations on binary states stored within a memory of a specific apparatus or special purpose computing device or platform. In the context of this particular specification, the term specific apparatus or the like includes a general purpose computing device, such as general purpose computer, once it is programmed to perform particular functions pursuant to instructions from program software. Algorithmic descriptions and/or symbolic representations are examples of techniques used by those of ordinary skill in the signal processing and/or related arts to convey the substance of their work to others skilled in the art. An algorithm is here, and generally, is considered to be a self-consistent sequence of operations and/or similar signal processing leading to a desired result. In this context, operations and/or processing involve physical manipulation of physical quantities. Typically, although not necessarily, such quantities may take the form of electrical and/or magnetic signals and/or states capable of being stored, transferred, combined, compared or otherwise manipulated as electronic signals and/or states representing information. It has proven convenient at times, principally for reasons of common usage, to refer to such signals and/or states as bits, data, values, elements, symbols, characters, terms, numbers, numerals, information, and/or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing device. In the context of this specification, therefore, a special purpose computer and/or a similar special purpose computing device is capable of manipulating and/or transforming signals and/or states, typically represented as physical electronic and/or magnetic quantities within memories, registers, and/or other information storage devices, transmission devices, and/or display devices of the special purpose computer and/or similar special purpose computing device. In the context of this particular patent application, the term "specific apparatus" may include a general purpose computing device, such as a general purpose computer, once it is programmed to perform particular functions pursuant to instructions from program software.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation and/or a physical change or transformation in molecular structure, such as from crystalline to amorphous or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state form a binary one to a binary zero or vice-versa in a memory device may comprise a transformation, such as a physical transformation. Rather, the foregoing is intended as illustrative examples.

A computer-readable (storage) medium typically may be non-transitory and/or comprise a non-transitory device. In this context, a non-transitory storage medium may include a device that is tangible, meaning that the device has a concrete physical form, although the device may change its physical state. Thus, for example, non-transitory refers to a device remaining tangible despite a change in state.

While there has been illustrated and/or described what are presently considered to be example features, it will be understood by those skilled in the art that various other modifications may be made and/or equivalents may be substituted, without departing from claimed subject matter. Additionally, many modifications may be made to adapt a particular situation to the teachings of claimed subject matter without departing from the central concept(s) described herein.

Therefore, it is intended that claimed subject matter not be limited to the particular examples disclosed, but that such claimed subject matter may also include all aspects falling within the scope of appended claims and/or equivalents thereof.

The invention claimed is:

1. A memory device, comprising:
    a phase change memory (PCM) cell positioned between a first electrode and a second electrode, wherein a portion of said first electrode comprises a material exhibiting a positive temperature coefficient of resistance (TCR),
    wherein said first electrode is formed on a vertical wall of a trench in a dielectric material, and
    wherein said first electrode has a narrow wall-type shape comprising a relatively narrow vertical edge and a relatively broad vertical face.

2. The memory device of claim 1, wherein the portion of the first electrode comprises a material having a positive TCR of approximately 0.01 and/or greater.

3. The memory device of claim 1, wherein the portion of one the first electrode comprises a material having a positive TCR of approximately 0.05 and/or greater.

4. The memory device of claim 1, wherein the first electrode comprises a material conformally deposited on the vertical wall of the trench.

5. The memory device of claim 1, wherein the portion of the first electrode comprises a first portion having a positive TCR and a second portion, wherein the first portion contacts the PCM cell and wherein the second portion does not contact the PCM cell.

6. The memory device of claim 1, wherein the PCM cell comprises a chalcogenide glass material.

7. The memory device of claim 1, wherein the portion of the first electrode comprises $BaTiO_3$.

8. The memory device of claim 1, wherein the portion of the first electrode contacts the PCM cell.

9. A method, comprising:
    generating a voltage across a first electrode and a second electrode to induce a current through the electrodes and through a PCM cell contacting the electrodes,
    wherein said first electrode has a narrow wall-type shape comprising a relatively narrow vertical edge and a relatively broad vertical face; and
    wherein a resistance characteristic of a portion of said first electrode increases with an increase in temperature of the portion.

10. The method of claim 9, wherein the generating the voltage comprises generating a programming voltage across the electrodes.

11. The method of claim 10, wherein the generating the programming voltage comprises melting a region of the PCM cell contacting the portion.

12. The method of claim 11, wherein melting the region contacting the portion comprises heating the region by generating the programming voltage.

13. The method of claim 12, wherein the resistance characteristic of the portion comprises an increased resistance in response to the heating of the region.

14. The method of claim 13, further comprising: generating a voltage across the electrodes to sense a state of the region.

15. The method of claim 14, wherein the generating a voltage across the electrodes to sense a state of the PCM cell comprises the portion having a reduced resistance as compared to the increased resistance in response to the heating of the region.

16. A memory device, comprising:
    an array of phase change memory (PCM) cells comprising one or more PCM cells electrically connected between a first electrode and a second electrode, wherein said first electrode comprises a material having a resistivity that substantially increases with a corresponding increase in temperature,
    wherein said first electrode has a narrow wall-type shape comprising a relatively narrow vertical edge and a relatively broad vertical face.

17. The memory device of claim 16, wherein the second electrode comprises an electrically conductive material having a resistivity lower than the first electrode.

18. The memory device of claim 16, further comprising an electrically conductive component coupled to the first electrode, wherein the electrically conductive component comprises a metal material.

19. The memory device of claim 16, wherein the first electrode comprises a first and a second portion, wherein the first portion comprises a material having a positive temperature coefficient of resistance (TCR).

20. The memory device of claim 18, wherein the second portion comprises a material having a smaller TCR as compared to the first portion.

* * * * *